United States Patent
Nishimura et al.

(10) Patent No.: US 8,816,571 B2
(45) Date of Patent: Aug. 26, 2014

(54) MANUFACTURING METHOD FOR PIEZOELECTRIC ELEMENT AND MOTHER PIEZOELECTRIC SUBSTRATE WITH ELECTRODE

(71) Applicant: Murata Manufacturing Co., Ltd., Nagaokakyo (JP)

(72) Inventors: Toshio Nishimura, Nagaokakyo (JP); Masanaga Nishikawa, Nagaokakyo (JP); Kazuhiko Sashisaki, Nagaokakyo (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 0 days.

(21) Appl. No.: 13/895,445

(22) Filed: May 16, 2013

(65) Prior Publication Data

US 2013/0241360 A1    Sep. 19, 2013

Related U.S. Application Data

(63) Continuation of application No. PCT/JP2011/074836, filed on Oct. 27, 2011.

(30) Foreign Application Priority Data

Dec. 1, 2010   (JP) ................................. 2010-268372

(51) Int. Cl.
*H01L 41/047*   (2006.01)
*H01L 41/22*   (2013.01)

(52) U.S. Cl.
USPC ........................................ 310/365; 29/25.35

(58) Field of Classification Search
USPC ........................................ 310/365; 29/25.35
See application file for complete search history.

(56) References Cited

U.S. PATENT DOCUMENTS

| | | | |
|---|---|---|---|
| 8,164,235 B2 * | 4/2012 | Koyama | 310/365 |
| 2004/0036383 A1 * | 2/2004 | Rubach | 310/365 |

FOREIGN PATENT DOCUMENTS

| | | | | |
|---|---|---|---|---|
| JP | 61-075631 | | 5/1986 | |
| JP | 03-046380 | * | 2/1991 | ............. H01L 41/09 |
| JP | 08-186459 | | 7/1996 | |
| JP | 11-094555 | | 4/1999 | |
| JP | 2002-190457 A | | 7/2002 | |
| JP | 3456108 B2 | | 10/2003 | |
| JP | 2007-0208771 A | * | 8/2007 | ............. H03H 9/19 |
| JP | 4-273186 B2 | | 6/2009 | |
| WO | WO 2009/020022 | * | 2/2009 | ............. H01L 41/08 |

OTHER PUBLICATIONS

PCT/JP2011/074836 International Search Report dated Jan. 4, 2012.
PCT/JP2011/074836 Written Opinion dated Jan. 4, 2012.

* cited by examiner

*Primary Examiner* — Thomas Dougherty
(74) *Attorney, Agent, or Firm* — Dickstein Shapiro LLP

(57) ABSTRACT

A method of manufacturing a piezoelectric element, which includes a first electrode adjacent a first main surface of a mother piezoelectric substrate and a second electrode adjacent a second main surface. During formation of the first electrode and the second electrode, cutouts are provided in the first electrode and the second electrode so that the shapes of the first electrode and the second electrode are different from each other when the mother piezoelectric substrate is inverted.

20 Claims, 7 Drawing Sheets ered States Patent US 8,816,571 B2

MANUFACTURING METHOD FOR PIEZOELECTRIC ELEMENT AND MOTHER PIEZOELECTRIC SUBSTRATE WITH ELECTRODE

CROSS REFERENCE TO RELATED APPLICATIONS

The present application is a continuation of International application No. PCT/JP2011/074836, filed Oct. 27, 2011, which claims priority to Japanese Patent Application No. 2010-268372, filed Dec. 1, 2010, the entire contents of each of which are incorporated herein by reference.

FIELD OF THE INVENTION

The present invention is related to, for example, a manufacturing method for a piezoelectric element, which is used for manufacturing a piezoelectric element such as a piezoelectric actuator or a piezoelectric resonator, and in more detail, related to a manufacturing method for a piezoelectric element, which includes a process for obtaining individual piezoelectric elements from a mother piezoelectric substrate, and a mother piezoelectric substrate with an electrode.

BACKGROUND OF THE INVENTION

In the past, when a piezoelectric element such as a piezoelectric actuator has been manufactured, a mother piezoelectric substrate has been prepared so as to increase productivity. This mother piezoelectric substrate has been divided, and separated into individual fractional piezoelectric elements. Incidentally, when a piezoelectric element has been manufactured, a poling treatment has been performed in the stage of a mother piezoelectric substrate. Accordingly, when, on a substrate or the like, a piezoelectric element has been mounted that has been obtained by dividing and separating the mother piezoelectric substrate into individual fractions, it has been necessary to confirm the polarization direction of the piezoelectric element and mount the piezoelectric element so that the polarization direction has become a correct polarization direction.

So as to confirm the polarization direction of such a piezoelectric element as described above, a structure illustrated in FIG. 9 has been used in Patent Document 1 described below. FIG. 9 is a perspective view illustrating a piezoelectric element 1001 of the related art.

In the piezoelectric element 1001 illustrated in FIG. 9, a first electrode 1003 is formed on the top surface of the piezoelectric substrate 1002. In the center of the first electrode 1003, a through hole 1004 is formed. On the other hand, in the entire bottom surface of the piezoelectric substrate 1002, a second electrode 1005 is formed so as to face the first electrode 1003. In the second electrode 1005, no through hole is provided. In addition, the piezoelectric substrate 1002 has been subjected to a poling treatment in a thickness direction as indicated by an arrow illustrated in the drawing.

In the piezoelectric element 1001, since the above-mentioned through hole 1004 is provided in the first electrode 1003, it is possible to identify a polarization direction. In other words, when the mass-produced piezoelectric element 1001 is observed from the outside, it is possible to identify the polarization direction on the basis of the presence or absence of the through hole 1004.

In addition, in Patent Document 2, a manufacturing method described below has been disclosed. First, electrodes are formed on the entire surfaces of both main surfaces of a mother piezoelectric substrate. Next, the mother piezoelectric substrate is subjected to a poling treatment. After doing that, a groove is formed in one of the electrodes of the both main surfaces of the mother piezoelectric substrate. Next, the mother piezoelectric substrate is divided, and a large number of piezoelectric elements are obtained that have been separated into fractions.

Patent Document 1: Japanese Unexamined Utility Model Registration Application Publication No. 61-75631
Patent Document 2: Japanese Unexamined Patent Application Publication No. 11-94555

SUMMARY OF THE INVENTION

In the piezoelectric element 1001 described in Patent Document 1, it is possible to identify the polarization direction owing to the through hole 1004. However, in the piezoelectric element 1001, an electric field strength is decreased in a portion where the through hole 1004 is provided. Therefore, there has been a problem that a driving force is decreased in the case of being used as a piezoelectric actuator. In addition, there has also been a problem that, in the portion where the through hole 1004 is provided, the electric field strength is locally decreased and the piezoelectric substrate 1002 is damaged owing to stress concentration.

On the other hand, in the manufacturing method described in Patent Document 2, the groove is formed in the electrode after the poling treatment. Accordingly, before the formation of the groove, it has been difficult to identify the polarization direction of the mother piezoelectric substrate on the basis of an external appearance. Therefore, when the mother piezoelectric substrate after the poling treatment has been provided to a next process, there has been a risk that a post-process is performed on the mother piezoelectric substrate whose polarization direction is opposite to an intended polarization direction.

Objects of the present invention are to provide a manufacturing method for a piezoelectric element, which includes a process enabling a polarization direction to be reliably identified on the basis of an external appearance in the stage of a mother piezoelectric substrate after a poling treatment wherein the local reduction of an electric field strength hardly occurs, and to provide a mother piezoelectric substrate with an electrode, whose polarization direction is able to be identified on the basis of an external appearance.

A manufacturing method for a piezoelectric element according to the present invention includes a process that prepares a mother piezoelectric substrate including a first main surface and a second main surface facing the first main surface, a first electrode forming process that forms a first electrode in the first main surface of the mother piezoelectric substrate, and a second electrode forming process that forms a second electrode in the second main surface of the mother piezoelectric substrate. In addition, in the first electrode forming process and the second electrode forming process, a cutout is provided in at least one of the first electrode and the second electrode so that shapes of the first electrode and the second electrode become different from each other when the mother piezoelectric substrate is inverted, and the first electrode and the second electrode are formed so that the shapes of the first electrode and the second electrode become equal to each other aside from a portion in which the cutout is provided. Furthermore, the manufacturing method for a piezoelectric element according to the present invention includes a process that subjects the mother piezoelectric substrate to polarization, a process that holds the mother piezoelectric substrate in a holding member so that the cutout is capable of being observed from the outside, and a dividing process that divides the mother piezoelectric substrate into individual piezoelectric elements in a state of holding the mother piezoelectric substrate in the holding member.

In a specific aspect of the manufacturing method for a piezoelectric element according to the present invention, the mother piezoelectric substrate has a rectangular plate-like shape. Here, a cutout is formed in the first electrode when the first electrode is formed on the mother piezoelectric substrate, and at the time of the formation of the second electrode, in the second electrode, the cutout is formed in the second electrode so that the shapes of the first electrode and the second electrode coincide with each other when the mother piezoelectric substrate is viewed therethrough in a thickness direction. In this case, since the shape of the first electrode becomes different from the shape of the second electrode capable of being observed by inverting the mother piezoelectric substrate, it is possible to identify the first main surface and the second main surface of the mother piezoelectric substrate on the basis of an external appearance.

In another specific aspect of the manufacturing method for a piezoelectric element according to the present invention, a picking-up process is further included that picks up the piezoelectric element in a state of holding the mother piezoelectric substrate in the holding member, after the dividing process. In this case, it is possible to pick up a piezoelectric element separated into a fraction, with understanding the polarization direction thereof.

In yet another specific aspect of the manufacturing method for a piezoelectric element according to the present invention, in the picking-up process, a remaining piezoelectric element is picked up without picking up a piezoelectric element in which the cutout is formed. In this case, the piezoelectric element where the cutout is formed is not used, and it is possible to only pick up the remaining piezoelectric element where an electric field strength distribution is uniform.

In yet another specific aspect of the manufacturing method for a piezoelectric element according to the present invention, in the picking-up process, a remaining piezoelectric element is picked up before a piezoelectric element in which the cutout is formed, and next, the piezoelectric element in which the cutout is formed is picked up. In this case, the piezoelectric element in which the cutout is formed is picked up later. Therefore, it is possible for the piezoelectric element, where an electric field strength distribution is not uniform and in which the cutout is formed, to be picked up with being discriminated from the remaining normal piezoelectric element.

In yet another specific aspect of the manufacturing method for a piezoelectric element according to the present invention, in the picking-up process, a piezoelectric element in which the cutout is formed is detected. In this way, the piezoelectric element in which the cutout is preliminarily formed is detected, and hence, it is possible to select the piezoelectric element where an electric field strength distribution is not uniform.

In yet another specific aspect of the manufacturing method for a piezoelectric element according to the present invention, masks are individually disposed so as to cover the first and second main surfaces of the mother piezoelectric substrate, and the first and second electrodes are individually formed owing to a sputtering method. In this case, it is possible to simultaneously perform the formation of the electrodes and the formation of the cutout.

In yet another specific aspect of the manufacturing method for a piezoelectric element according to the present invention, the holding member has an adhesive surface, and the mother piezoelectric substrate is adhesively held in the adhesive surface. In this case, it is possible to temporarily stick the mother piezoelectric substrate in the holding member with ease, using the adhesive strength of the adhesive surface.

A mother piezoelectric substrate with an electrode according to the present invention includes a mother piezoelectric substrate configured to include a first main surface and a second main surface facing the first main surface, a first electrode provided in the first main surface of the mother piezoelectric substrate, and a second electrode provided in the second main surface of the mother piezoelectric substrate, wherein cutouts are formed in the first electrode and the second electrode so that it is possible to discriminate between the first main surface and the second main surface on the basis of an external appearance when the mother piezoelectric substrate is inverted.

In a specific aspect of the mother piezoelectric substrate with an electrode according to the present invention, the mother piezoelectric substrate has a rectangular plate-like shape, the first electrode and the second electrode have rectangular shapes including cutouts in two corner portions existing in diagonal positions of rectangles, and the first electrode and the second electrode have shapes of external forms coinciding with each other when the mother piezoelectric substrate is viewed therethrough in a thickness direction. In this case, when the mother piezoelectric substrate is inverted, electrode shapes become different. Therefore, it is possible to easily identify the first main surface and the second main surface of the mother piezoelectric substrate.

According to the manufacturing method for a piezoelectric element of the present invention, since the mother piezoelectric substrate is subjected to polarization after the first electrode and the second electrode have been formed so that at least one of the first electrode and the second electrode includes the cutout so as to be different in shapes when the mother piezoelectric substrate is inverted, it is possible to easily identify the first main surface and the second main surface of the mother piezoelectric substrate by observing, from the outside, the mother piezoelectric substrate after the polarization. In other words, it becomes possible to easily and reliably confirm the polarization direction of the mother piezoelectric substrate. Therefore, after confirming the polarization direction, it becomes possible to pick up and provide the piezoelectric element separated into a fraction, from the mother piezoelectric substrate whose polarization direction has been confirmed.

In the mother piezoelectric substrate with an electrode according to the present invention, since the cutout is formed in at least one of the first electrode and the second electrode so that electrode shapes become different when the mother piezoelectric substrate is inverted, it is possible to reliably confirm the polarization direction in the mother piezoelectric substrate on the basis of an external appearance, by subjecting the corresponding mother piezoelectric substrate with an electrode to a poling treatment. Accordingly, it becomes possible to extract, from the corresponding mother piezoelectric substrate, a piezoelectric element separated into a fraction, with understanding the polarization direction thereof.

DETAILED DESCRIPTION OF THE PREFERRED EMBODIMENTS

Hereinafter, specific embodiments of the present invention will be described with reference to drawings, and hence, the present invention will be clarified.

Figure 1A:
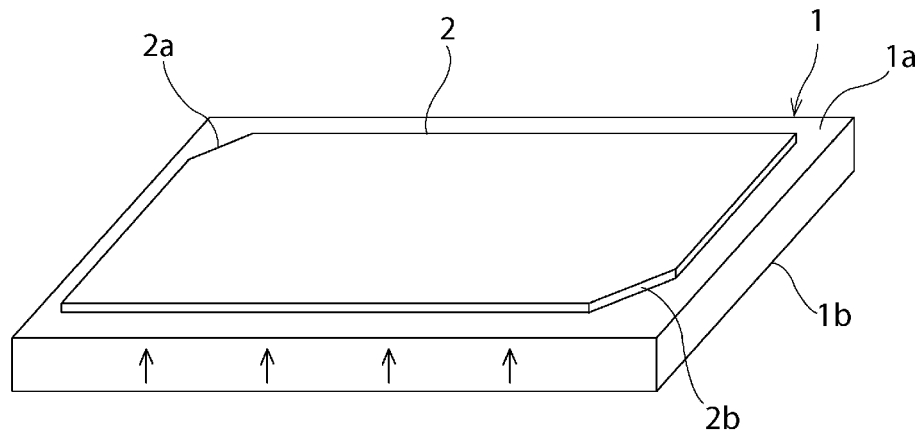
FIG. 1(a) is a perspective view illustrating a state where an electrode is formed on a mother piezoelectric substrate in a manufacturing method for a piezoelectric element according to a first embodiment of the present invention.
Figure 2A:
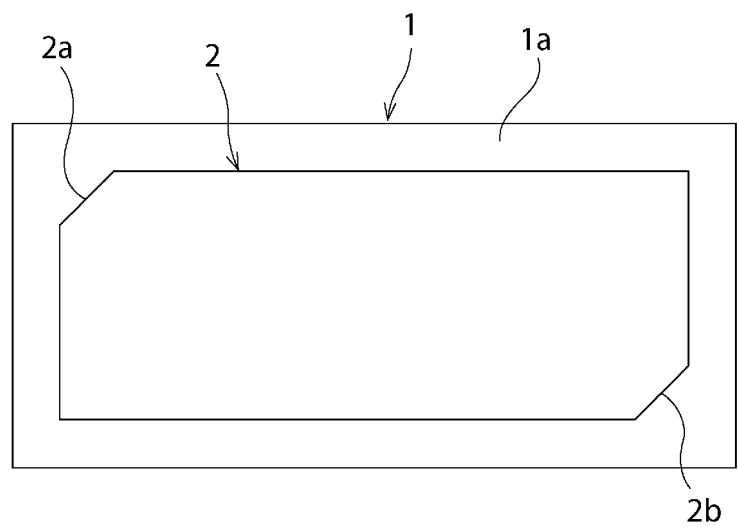
FIG. 2(a) is a schematic plan view of the mother piezoelectric substrate after a poling treatment in the manufacturing method for a piezoelectric element according to the first embodiment of the present invention.
Figure 2B:
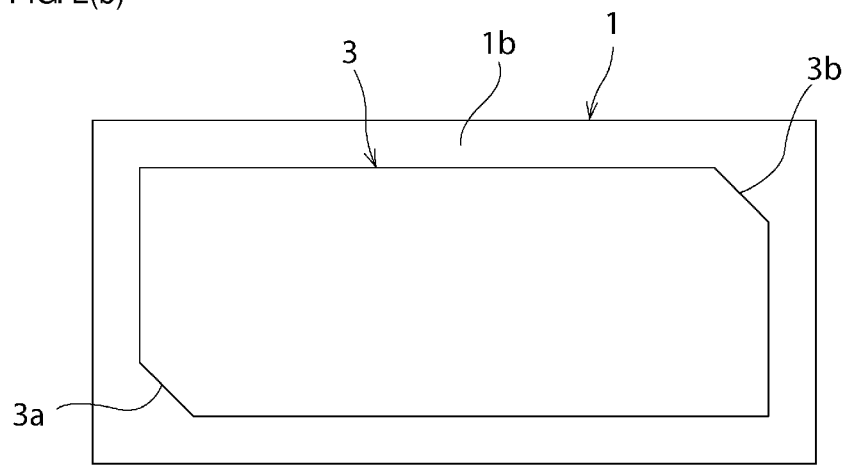
FIG. 2(b) is a schematic plan view when the mother piezoelectric substrate illustrated in FIG. 2(a) is inverted and viewed from a second electrode side.
Figure 3A:
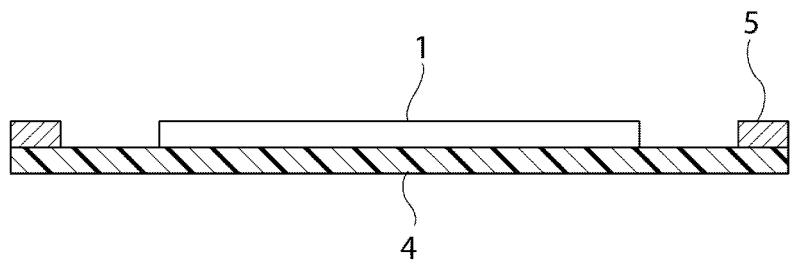
FIG. 3(a) is a cross-sectional view used for explaining a process for dicing the mother piezoelectric substrate in the manufacturing method for a piezoelectric element according to the first embodiment of the present invention.
Figure 3B:
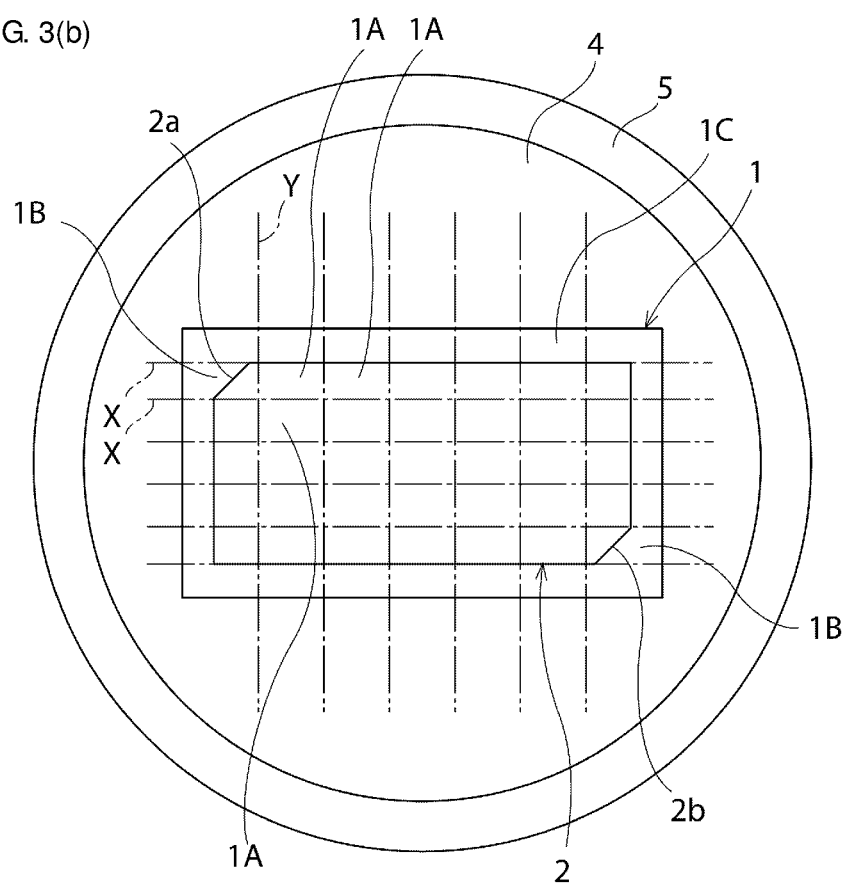
FIG. 3(b) is a schematic plan view thereof.
Figure 4:
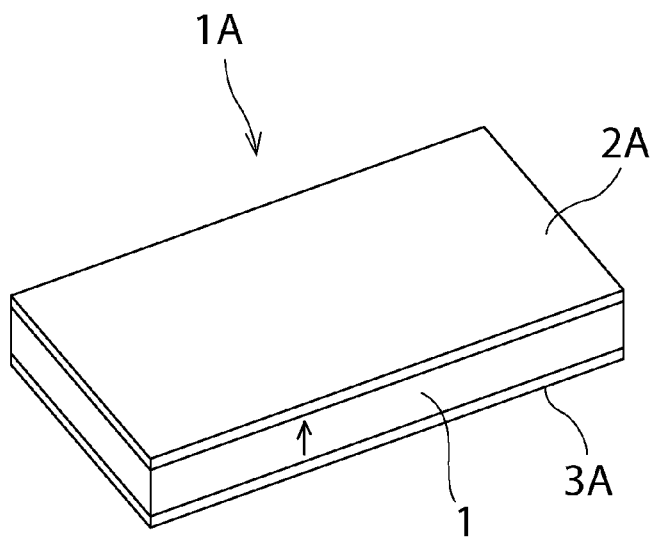
FIG. 4 is a perspective view illustrating a piezoelectric element obtained in the manufacturing method for a piezoelectric element according to the first embodiment of the present invention.

With reference to FIGS. 1(a) to FIG. 4, a manufacturing method for a piezoelectric element according to the first embodiment of the present invention will be described. FIG. 1(a) is a perspective view illustrating a state where an electrode is formed on a mother piezoelectric substrate in a manufacturing method for a piezoelectric element according to the first embodiment of the present invention, FIG. 1(b) is the schematic plan view of a first electrode, and FIG. 1(c) is the schematic plan view of a second electrode when the mother piezoelectric substrate is viewed therethrough. FIG. 2(a) is the schematic plan view of the mother piezoelectric substrate after a poling treatment in the manufacturing method for a piezoelectric element according to the first embodiment of the present invention, and FIG. 2(b) is a schematic plan view when the mother piezoelectric substrate illustrated in FIG. 2(a) is inverted, and viewed from a second electrode side. FIG. 3(a) is a cross-sectional view used for explaining a process for dicing the mother piezoelectric substrate in the manufacturing method for a piezoelectric element according to the first embodiment of the present invention, and FIG. 3(b) is the schematic plan view thereof. FIG. 4 is a perspective view illustrating a piezoelectric element obtained in the manufacturing method for a piezoelectric element according to the first embodiment of the present invention.

In the manufacturing method for a piezoelectric element according to the present embodiment, first a mother piezoelectric substrate 1 illustrated in FIG. 1(a) is prepared. The mother piezoelectric substrate 1 has a rectangular plate-like shape where a main surface includes long sides and short sides. The mother piezoelectric substrate 1 includes a first main surface 1a and a second main surface 1b facing the first main surface 1a. The mother piezoelectric substrate 1 is made of arbitrary piezoelectric ceramics such as lead zirconate titanate (PZT)-based ceramics.

The mother piezoelectric substrate 1 is not limited to the rectangular plate-like shape, and may also have another planar shape. From the viewpoint that it is possible to identify directionality owing to the external form of the mother piezoelectric substrate 1, it is desirable that, as for the main surface of the mother piezoelectric substrate 1, the shape of the external form thereof is not rotationally symmetrical and the direction of the main surface has directionality.

Figure 1B:
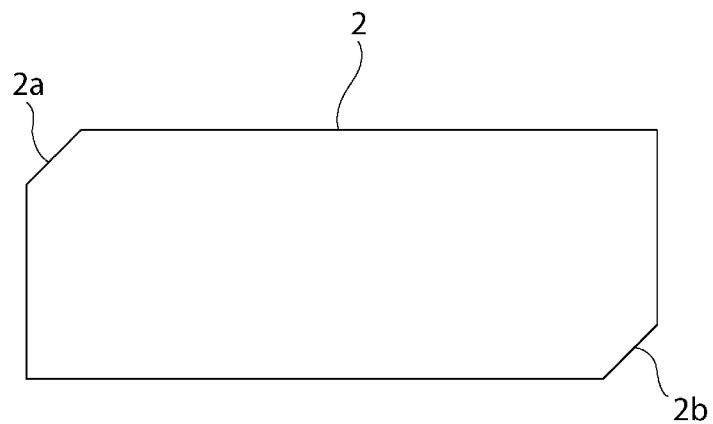
FIG. 1(b) is a schematic plan view of a first electrode.

In the present embodiment, a first electrode 2 is formed on the first main surface 1a of the above-mentioned mother piezoelectric substrate 1. The first electrode 2 has such a planar shape as illustrated in FIG. 1(b).

The first electrode 2 is made of an arbitrary metal such as Cu, Ag, Pd, Ni, Cr, or Au or the alloy thereof.

Figure 1C:
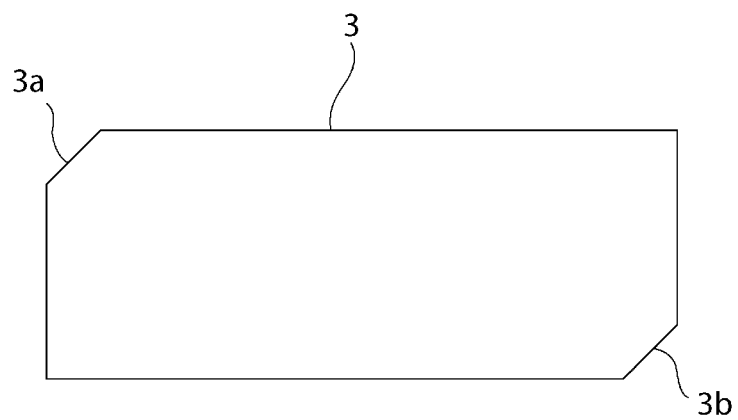
FIG. 1(c) is a schematic plan view of a second electrode when the mother piezoelectric substrate is viewed therethrough.

Subsequent to the formation of the above-mentioned first electrode 2, a second electrode 3 is formed on the second main surface 1b of the mother piezoelectric substrate 1. In addition, the second electrode 3 may also be formed before the first electrode 2. The second electrode 3 has such a planar shape as illustrated in FIG. 1(c). The second electrode 3 is made of an arbitrary metal such as Ag, Cu, Pd, Ni, Cr, or Au, or the alloy thereof, in the same way as the first electrode 2.

As illustrated in FIG. 1(a), the first electrode 2 has a rectangular shape including long sides and short sides, which is a substantially rectangular shape, and the first electrode 2 is formed on the first main surface 1a so that a rectangular frame-like blank space remains on the periphery thereof. As illustrated in FIG. 1(b), the first electrode 2 includes cutouts 2a and 2b in first and second corner portions corresponding to diagonal positions in the rectangular shape. In other words, portions located outside inclined-line portions extended in directions inclined with the long sides and the short sides of the rectangular shape in FIG. 1(b) are cut out.

In the same way, as illustrated in FIG. 1(c), the second electrode 3 also includes cutouts 3a and 3b in first and second corner portions located in diagonal positions. In the planar view of the mother piezoelectric substrate 1, the second electrode 3 is formed so as to overlap with the first electrode 2. In other words, when the mother piezoelectric substrate 1 is viewed therethrough from a first main surface 1a side, the second electrode 3 corresponds to a shape where a cutout whose size is the same is provided in the same position with respect to a rectangular shape whose shape is the same as the first electrode 2.

In the present embodiment, next, in the mother piezoelectric substrate 1, a direct-current voltage is applied between the first electrode 2 and the second electrode 3, and the mother piezoelectric substrate 1 is subjected to polarization in a thickness direction. Here, by connecting the second electrode 3 and the first electrode 2 to a positive electric potential and a negative electric potential, respectively, the mother piezoelectric substrate 1 is subjected to a poling treatment as indicated by an arrow illustrated in FIG. 1(a). In addition, a polarization direction may also be inverted.

The mother piezoelectric substrate 1 subjected to polarization in such a way as described above is pasted on a dicing sheet 4 serving as a holding member, as illustrated in FIGS. 3(a) and (b). It is pointed out that, in FIG. 3(a), the illustration of the first electrode 2 and the second electrode 3 is omitted.

The top surface of the dicing sheet 4 is caused to serve as an adhesive surface. The whole of the dicing sheet 4 is formed owing to an adhesive or an adhesive layer is formed on the top surface of a synthetic resin film, and hence, such an adhesive surface may be configured.

Using the adhesive strength of the dicing sheet 4, the above-mentioned mother piezoelectric substrate 1 after the poling treatment is stuck on the dicing sheet 4. Here, the mother piezoelectric substrate 1 is pasted on the top surface of the dicing sheet 4 from a second electrode 3 side.

In addition, a dicing ring 5 is pasted on the top surface of the above-mentioned dicing sheet 4. In addition, in this state, the mother piezoelectric substrate 1 is cut off in directions indicated by dashed-dotted lines X and dashed-dotted lines Y in FIG. 3(b), and divided into individual piezoelectric elements 1A. This cutoff may be performed owing to cutoff due to a dicing blade, the irradiation of laser light, or the like.

In such a way as described above, the mother piezoelectric substrate 1 is divided into a plurality of the piezoelectric elements 1A. The piezoelectric element 1A subjected to division is illustrated in a perspective view in FIG. 4. In the piezoelectric element 1A, a first electrode 2A is formed on the top surface of the piezoelectric substrate 1, and a second electrode 3A is formed on the bottom surface thereof. In addition, the piezoelectric substrate 1 turns out to be subjected to the poling treatment in a direction indicated by an illustrated arrow.

Returning to FIG. 3(b), after the mother piezoelectric substrate 1 has been divided as described above owing to the dicing blade, the irradiation of laser light, or the like, a tensile stress is applied to the dicing sheet 4 toward an outer side portion in a radial direction. A circle cylindrical jig is caused to come into contact with the bottom surface of the dicing sheet 4, the dicing ring 5 is caused to move to a jig side, and hence, this tensile stress may be applied. In this way, the piezoelectric elements 1A and 1A located on both sides of a dividing line are distanced from each other along a line. After doing that, the piezoelectric element 1A is picked up. In this way, it is possible to extract the piezoelectric element 1A illustrated in FIG. 4.

Incidentally, when the above-mentioned mother piezoelectric substrate 1 has been divided as illustrated in FIG. 3(b), in addition to the piezoelectric element 1A to be finally used as a product, piezoelectric elements 1B and 1B turn out to be formed that are located in portions where the above-mentioned cutouts 2a and 2b are provided. In other words, the piezoelectric elements 1B and 1B exist in portions where the cutouts 3a and 3b are provided.

In the piezoelectric elements 1B and 1B, electrodes are not formed on the entire surfaces of the top surface and the bottom surface of the piezoelectric substrate. Accordingly, in the piezoelectric element 1B, an electric field strength is locally decreased at the time of use. Accordingly, the piezoelectric element 1B is not used as a product. Therefore, the plural piezoelectric elements 1A are picked up first, and the piezoelectric elements 1B not to be used as products are picked up last. In this way, the piezoelectric elements 1A to be used as products are only selected. Furthermore, in addition to the above-mentioned piezoelectric elements 1A and 1B, a piezoelectric substrate fraction 1C serving as a blank space portion is finally picked up where no first electrode 2 and no second electrode 3 are formed.

In the manufacturing method of the present embodiment, when the mother piezoelectric substrate 1 after the poling treatment is stuck on the dicing sheet 4, it is possible to confirm the polarization direction and paste the mother piezoelectric substrate 1 on the dicing sheet 4. In other words, the above-mentioned cutouts 2a, 2b, 3a, and 3b are formed in the first electrode 2 and the second electrode 3. Accordingly, in order to maintain the polarization direction illustrated in FIG. 1(a), namely, prepare the mother piezoelectric substrate 1 so that the arrow of the polarization direction points upward, it is only necessary to stick the mother piezoelectric substrate 1 on the dicing sheet 4 from the second electrode 3 side so that the first electrode 2 becomes a top surface. In this case, as illustrated in FIG. 2(a), in planar view where the long side of the mother piezoelectric substrate 1 or the first electrode 2 is located on a lower side, the cutouts 2a and 2b turn out to be located in corner portions on the upper left side and the lower right side of the first electrode 2.

On the other hand, when the mother piezoelectric substrate 1 after the poling treatment is erroneously inverted, in the planar view of the mother piezoelectric substrate 1, the long side of the mother piezoelectric substrate 1 or the second electrode 3 is located on a lower side in planar view, as illustrated in FIG. 2(b). Therefore, a state occurs where the cutouts 3a and 3b turn out to be located in corner portions on the lower left side and the upper right side of the second electrode 3, and it is possible to determine that the second electrode 3 is located on the top surface side. Therefore, in a case where the mother piezoelectric substrate 1 is disposed so that the first electrode 2 is located on the top surface side, in the planar view of the mother piezoelectric substrate 1, the cutouts 2a and 2b turn out to be located on the upper left side and the lower right side, as illustrated in FIG. 3(b). Accordingly, while the polarization direction of the mother piezoelectric substrate 1 is confirmed owing to the positions of the cutouts, it is possible to reliably paste the piezoelectric substrate 1 on the dicing sheet 4 from the second electrode 3 side.

Therefore, after confirming the polarization direction in such a way as described above, it is possible to perform the division of the mother piezoelectric substrate 1 and the above-mentioned picking up, in a state where the mother piezoelectric substrate 1 is pasted on the dicing sheet 4. Furthermore, in a case where the shapes of the first electrode and the second electrode are caused to coincide with each other when the mother piezoelectric substrate is viewed therethrough from a first main surface side, namely, viewed therethrough in the thickness direction of the mother piezoelectric substrate, a region becomes small where an electric field applied when the mother piezoelectric substrate is subjected to polarization becomes discontinuous, compared with a case where the shapes of the first electrode and the second electrode do not coincide with each other when the mother piezoelectric substrate is viewed therethrough in the thickness direction of the mother piezoelectric substrate. Therefore, it is possible to obtain the mother piezoelectric substrate uniformly subjected to polarization.

In addition, while, in the above-mentioned embodiment, the piezoelectric element 1B and piezoelectric substrate fraction 1C not to be used as products have also been picked up after the dividing process, these may not be picked up. In addition, it is desirable that, in the above-mentioned picking-up process, an image taken by a camera may be determined, the piezoelectric element 1B in which the cutouts 2a and 2b are formed may be detected by being macroscopically observed, and the corresponding piezoelectric element 1B may also be excluded from targets to be picked up. Alternatively, the detected piezoelectric element 1B may also be picked up as a disused article after the remaining piezoelectric element 1A has been picked up.

As described above, according to the manufacturing method for a piezoelectric element of the present embodiment, after the mother piezoelectric substrate 1 has been subjected to the poling treatment in the thickness direction, the cutouts 2a, 2b, 3a, and 3b are formed in the first electrode 2 and the second electrode 3 so as to be able to identify the first main surface 1a and the second main surface 1b of the mother piezoelectric substrate 1. Accordingly, it is possible to reliably confirm the polarization direction of the mother piezoelectric substrate 1.

In addition, the cutouts 2a, 2b, 3a, and 3b may also be formed owing to etching or the like after a rectangular electrode has been formed. However, it is desirable that masks or resist patterns are individually disposed so as to cover the first main surface 1a and the second main surface 1b of the mother piezoelectric substrate 1, and it is preferable to form the first electrode 2 and the second electrode 3 owing to a sputtering method, a vapor deposition method, or the like. Accordingly, it is possible to form the cutouts 2a, 2b, 3a, and 3b simultaneously with the first electrode 2 and the second electrode 3.

Figure 5A:
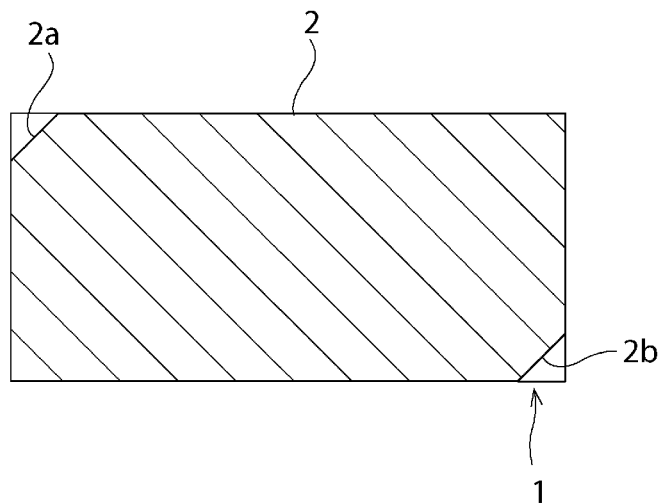
FIGS. 5(a) and 5(b) are a schematic plan view of a mother piezoelectric substrate in a state where an electrode is formed on the mother piezoelectric substrate and a schematic plan view of a second electrode when the mother piezoelectric substrate is viewed therethrough, in a manufacturing method for a piezoelectric element according to a first example of a modification to the first embodiment of the present invention.
Figure 5B:
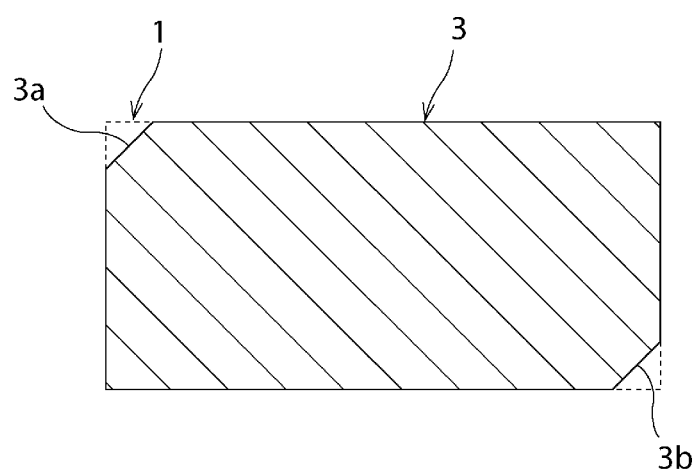

In addition, while, in the above-mentioned embodiment, the first electrode 2 and the second electrode 3 have been formed so that rectangular frame-like blank spaces remain in the first main surface 1a and the second main surface 1b of the mother piezoelectric substrate 1 and on the peripheries thereof, the first electrode 2 and the second electrode 3 may also be formed so as to follow the outer peripheral edge of the rectangular plate-like mother piezoelectric substrate 1. FIG. 5(a) is the schematic plan view of the mother piezoelectric substrate 1 in a state where an electrode is formed on the mother piezoelectric substrate 1, in a manufacturing method for a piezoelectric element according to a first example of a modification to the first embodiment of the present invention, and FIG. 5(b) is the schematic plan view of the second electrode 3 when the mother piezoelectric substrate 1 is viewed therethrough. After rectangular electrodes have been formed so as to cover the entire surfaces of the first main surface 1a and the second main surface 1b of the mother piezoelectric substrate 1, the cutouts 2a, 2b, 3a, and 3b may also be provided in corner portions located in diagonal positions in the corresponding electrodes, owing to etching or the like.

Figure 6:
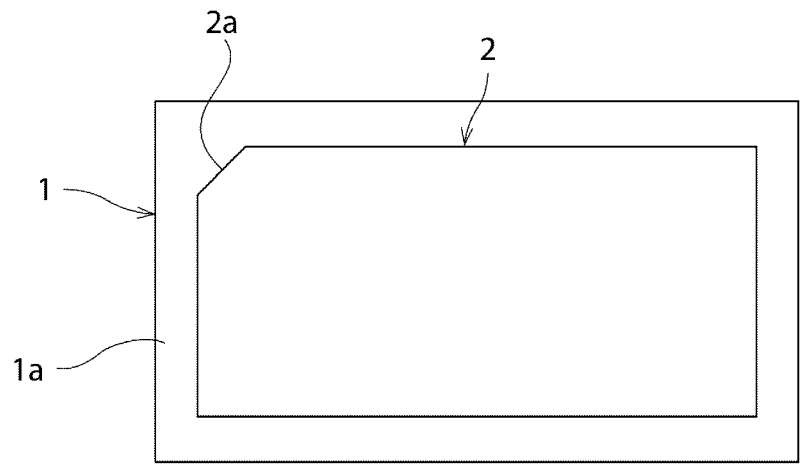
FIG. 6 is a schematic plan view of a mother piezoelectric substrate in a state where an electrode is formed on the mother piezoelectric substrate, in a manufacturing method for a piezoelectric element according to a second example of a modification to the first embodiment of the present invention.
Figure 7:
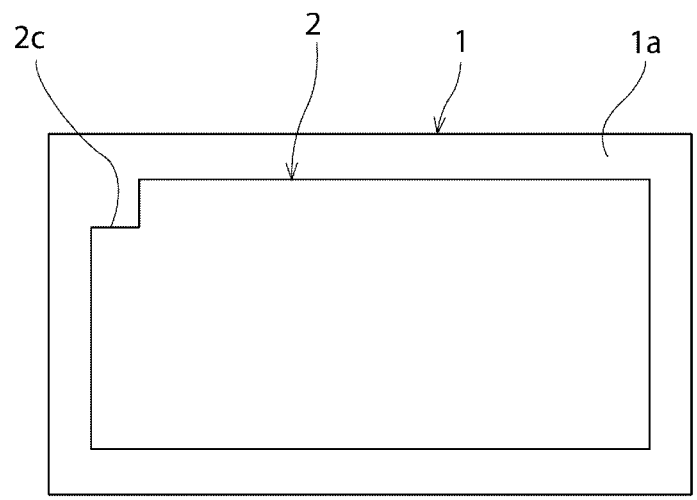
FIG. 7 is a schematic plan view of a mother piezoelectric substrate in a state where an electrode is formed on the mother piezoelectric substrate, in a manufacturing method for a piezoelectric element according to a third example of a modification to the first embodiment of the present invention.
Figure 8:
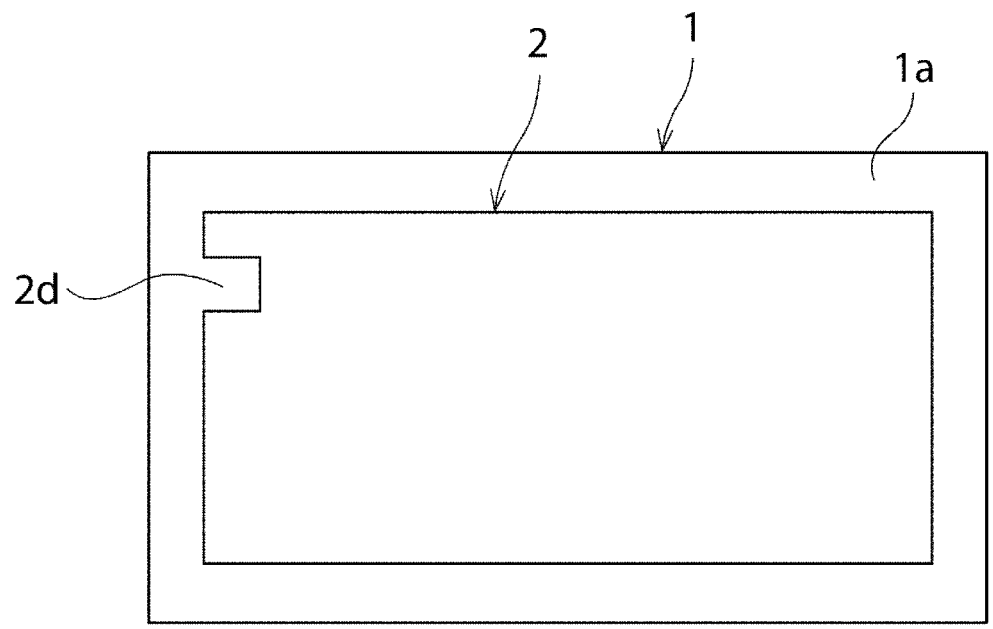
FIG. 8 is a schematic plan view of a mother piezoelectric substrate in a state where an electrode is formed on the mother piezoelectric substrate, in a manufacturing method for a piezoelectric element according to a fourth example of a modification to the first embodiment of the present invention.
Figure 9:
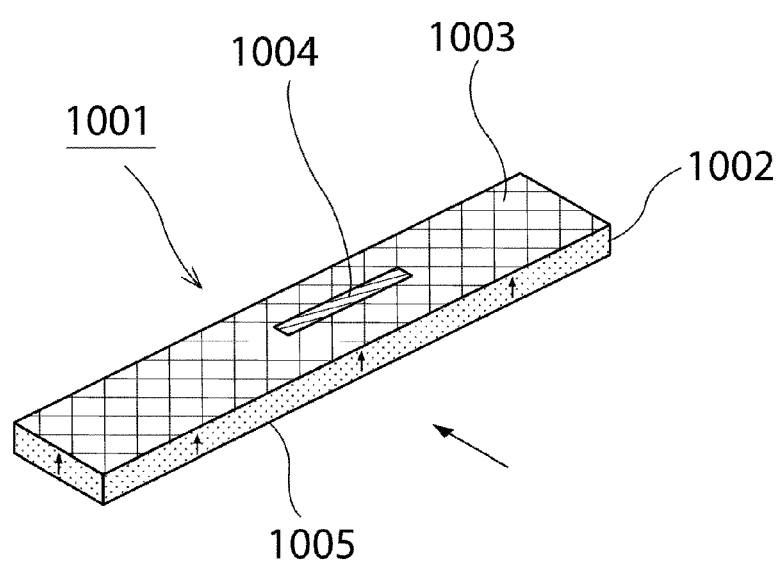
FIG. 9 is a perspective view illustrating a piezoelectric element of the related art.

In addition, while, in the above-mentioned embodiment, the above-mentioned cutouts 2a and 2b have been provided, the shapes and the numbers of cutouts formed in the first electrode and the second electrode may be arbitrarily formed in the present invention. FIG. 6 is the schematic plan view of a mother piezoelectric substrate in a state where an electrode is formed on the mother piezoelectric substrate, in a manufacturing method for a piezoelectric element according to a second example of a modification to the first embodiment of the present invention. FIG. 7 is the schematic plan view of a mother piezoelectric substrate in a state where an electrode is formed on the mother piezoelectric substrate, in a manufacturing method for a piezoelectric element according to a third example of a modification to the first embodiment of the present invention. FIG. 8 is the schematic plan view of a mother piezoelectric substrate in a state where an electrode is formed on the mother piezoelectric substrate, in a manufacturing method for a piezoelectric element according to a fourth example of a modification to the first embodiment of the present invention.

For example, as illustrated in FIG. 6, the cutout 2a may only be provided in one corner portion of the rectangular-shaped first electrode 2. In this case, the second electrode 3 may also be configured so as to have the same planar shape as the first electrode 2 when the mother piezoelectric substrate 1 is viewed therethrough. Also in this case, when the mother piezoelectric substrate 1 has been erroneously inverted after the poling treatment, the corner portion of the second electrode 3 provided in the second main surface 1b is different from the position illustrated in FIG. 5 and located in a lower left corner side portion. Accordingly, in the same way as the above-mentioned embodiment, it is possible to reliably discriminate between the first main surface 1a and the second main surface 1b of the mother piezoelectric substrate 1.

In addition, as illustrated in FIG. 7, in one corner portion of the rectangular-shaped first electrode 2, a cutout 2c may also be formed on such a manner that a substantially square or rectangular portion is removed.

In addition, as illustrated in FIG. 8, a cutout 2d may also be provided in a portion of the short side in the rectangular-shaped first electrode 2. In this case, in the second electrode 3, a cutout having the same shape may also be formed at the same position when the mother piezoelectric substrate 1 is viewed therethrough. As long as the cutout 2d is located away from the center of the short side of the first electrode 2, when the mother piezoelectric substrate 1 has been erroneously inverted after the poling treatment, the cutout provided in the second electrode 3 turns out to appear at a position different from the case of FIG. 8. In other words, in the above-mentioned short side, the cutout provided in the second electrode 3 turns out to appear at a position on an opposite side with the length direction of the short side as a center. Accordingly, in the same way as the above-mentioned embodiment, it is possible to identify the first main surface 1a and the second main surface 1b of the mother piezoelectric substrate 1.

As illustrated in FIG. 6 to FIG. 8, in the present invention, the shape of the cutout causing the first main surface 1a and the second main surface 1b of the mother piezoelectric substrate 1 to be identified is not specifically limited.

In addition, aside from the portions where the above-mentioned cutouts are formed, it is necessary for the first electrode 2 and the second electrode 3 to have the same shape. Accordingly, in a first electrode formation portion other than the portion where the cutout is formed, since the shapes of the first electrode 2 and the second electrode 3 are equal to each other, it is possible to obtain the individual piezoelectric elements 1A where an electric field strength distribution is uniform.

In the manufacturing method for a piezoelectric element according to the present invention, as described above, the first electrode and the second electrode overlap with each other through the mother piezoelectric substrate, and cutouts capable of identifying the first main surface and the second main surface of the mother piezoelectric substrate owing to the external appearances thereof are formed in the first electrode and the second electrode. Therefore, as described above, it is possible to reliably identify the polarization direction. In addition, it is only necessary for the above-mentioned cutout to be provided in at least one of the first electrode and the second electrode, and it is not necessary for the above-mentioned cutout to be provided in both of the first electrode and the second electrode.

In addition, the manufacturing method for a piezoelectric element of the present invention is not limited to a piezoelectric actuator, and is also applicable to the manufacturing of various piezoelectric elements such as a piezoelectric resonator and the like.

In addition, the mother piezoelectric substrate 1 is not limited to a single-layered piezoelectric substrate, and may also be a multilayer type piezoelectric substrate where a plurality of piezoelectric layers are laminated.

REFERENCE SIGNS LIST 1 mother piezoelectric substrate
1A, 1B piezoelectric element
1C piezoelectric substrate fraction
1a, 1b first main surface, second main surface
2 first electrode
2a to 2d cutout
2A first electrode
3 second electrode
3a, 3b cutout
3A second electrode
4 dicing sheet
5 dicing ring

The invention claimed is:

1. A method of manufacturing a piezoelectric element, the method comprising:
    preparing a mother piezoelectric substrate including a first main surface and a second main surface facing the first main surface;
    forming a first electrode adjacent the first main surface of the mother piezoelectric substrate; and
    forming a second electrode adjacent the second main surface of the mother piezoelectric substrate;
    providing a cutout in at least one of the first electrode and the second electrode so that shapes of the first electrode and the second electrode are different from each other when the mother piezoelectric substrate is inverted; and
    dividing the mother piezoelectric substrate into individual piezoelectric elements in a state when the cutout is viewable and oriented in a predetermined position.

2. The method of manufacturing a piezoelectric element according to claim 1, wherein the first electrode and the second electrode are formed so that the shape of the first electrode and the shape of the second electrode are equal to each other aside from a portion in which the cutout is provided.

3. The method of manufacturing a piezoelectric element according to claim 1, further comprising subjecting the mother piezoelectric substrate to polarization.

4. The method of manufacturing a piezoelectric element according to claim 1, further comprising placing the mother piezoelectric substrate in a holding member so that the cutout is visible when in the holding member.

5. The method of manufacturing a piezoelectric element according to claim 1, wherein the mother piezoelectric substrate has a rectangular plate-like shape, the cutout is formed in the first electrode when the first electrode is foamed adjacent the mother piezoelectric substrate, and at a time of the formation of the second electrode, a second cutout is formed in the second electrode so that the shapes of the first electrode and the second electrode coincide with each other when the mother piezoelectric substrate is viewed therethrough in a thickness direction.

6. The method of manufacturing a piezoelectric element according to claim 4, further comprising:
    picking-up the piezoelectric elements when the mother piezoelectric substrate is in the holding member, and after the dividing of the mother piezoelectric substrate.

7. The method of manufacturing a piezoelectric element according to claim 6, wherein during the picking-up, the piezoelectric elements are picked up, other than a piezoelectric element having the cutout.

8. The method of manufacturing a piezoelectric element according to claim 6, wherein during the picking-up, a piezoelectric element not having a cutout is picked up before a piezoelectric element having the cutout, and thereafter, the piezoelectric element having the cutout is picked up.

9. The method of manufacturing a piezoelectric element according to claim 6, wherein during the picking-up, a piezoelectric element having the cutout is detected.

10. The method of manufacturing a piezoelectric element according to claim 1, further comprising:
    disposing individual masks so as to cover the first and second main surfaces of the mother piezoelectric substrate, and the first and second electrodes are individually formed by sputtering.

11. The method of manufacturing a piezoelectric element according to claim 4, wherein the holding member has an adhesive surface, and the mother piezoelectric substrate is adhesively held on the adhesive surface.

12. The method of manufacturing a piezoelectric element according to claim 1, wherein the first and second electrodes are formed such that a rectangular frame-like space is provided along a periphery of the first and second main surfaces of the mother piezoelectric substrate.

13. A mother piezoelectric substrate used for manufacturing a plurality of piezoelectric elements, the substrate comprising:
    a piezoelectric substrate having a first main surface and a second main surface opposite the first main surface; and
    a first electrode adjacent the first main surface of the piezoelectric substrate and a second electrode adjacent the second main surface of the piezoelectric substrate, wherein
    at least one of the first electrode and the second electrode include at least one cutout configured such that it is possible to discriminate between the first main surface and the second main surface on the basis of an external appearance of the at least one of the first electrode and the second electrode when the piezoelectric substrate is inverted.

14. The mother piezoelectric substrate according to claim 13, wherein the piezoelectric substrate has a rectangular plate-like shape, the first electrode and the second electrode each have rectangular shapes, the first electrode includes the at least one cutout, and the second electrode includes at least a second cutout in a location such that the rectangular shapes of the first electrode and the second electrode coincide with each other when the piezoelectric substrate is viewed therethrough in a thickness direction.

15. The mother piezoelectric substrate according to claim 13, wherein the first and second electrodes are shaped such that a rectangular frame-like space is provided along a periphery of the first and second main surfaces of the piezoelectric substrate.

16. The mother piezoelectric substrate according to claim 13, wherein the at least one cutout extends diagonally across a portion of the at least one of the first electrode and the second electrode.

17. The mother piezoelectric substrate according to claim 13, wherein the at least one cutout is substantially square-shaped.

18. The mother piezoelectric substrate according to claim 13, wherein the at least one cutout is provided in a portion of a side of the at least one of the first electrode and the second electrode.

19. The mother piezoelectric substrate according to claim 13, wherein both the first electrode and the second electrode include at least one respective cutout.

20. The mother piezoelectric substrate according to claim 13, wherein both the first electrode and the second electrode each include two respective cutouts.

\* \* \* \* \*